United States Patent [19]

Matsuoka

[11] Patent Number: 4,800,251

[45] Date of Patent: Jan. 24, 1989

[54] APPARATUS FOR FORMING A RESIST PATTERN

[75] Inventor: Yasuo Matsuoka, Kawasaki, Japan

[73] Assignee: Kabushiki Kaisha Toshiba, Kawasaki, Japan

[21] Appl. No.: 884,640

[22] Filed: Jul. 11, 1986

[30] Foreign Application Priority Data

Jul. 16, 1985 [JP] Japan .................................. 60-156510

[51] Int. Cl.⁴ ............................ B23K 9/00; B44C 1/22
[52] U.S. Cl. ............................. 219/121.43; 219/121.4; 156/646; 156/345; 430/313; 430/330; 204/192.1
[58] Field of Search ................... 219/121 PD–121 PG, 219/121 PR; 156/643, 646, 345; 204/192.15, 192.1, 192.25; 430/312, 313, 287, 5, 330, 325; 427/34

[56] References Cited

U.S. PATENT DOCUMENTS

| | | | |
|---|---|---|---|
| 4,292,384 | 9/1981 | Straughan et al. | 219/121 PE |
| 4,430,547 | 2/1984 | Yoneda et al. | 219/121 PG |
| 4,507,539 | 3/1985 | Sando et al. | 219/121 PG |
| 4,557,797 | 12/1985 | Fuller et al. | 156/643 |
| 4,565,601 | 1/1986 | Kakehi et al. | 156/345 |
| 4,568,734 | 2/1986 | Tan et al. | 430/287 |
| 4,645,562 | 2/1987 | Liao et al. | 156/643 |
| 4,657,618 | 4/1987 | Spencer et al. | 156/345 |
| 4,693,777 | 9/1987 | Hazano et al. | 156/345 |
| 4,699,689 | 10/1987 | Bersin | 156/345 |

OTHER PUBLICATIONS

Japanese Patent Disclosure (KOKAI) No. 57-66642, "Plasma Etching Machine" Mitsubishi Electric Co.

*Primary Examiner*—M. H. Paschall
*Attorney, Agent, or Firm*—Finnegan, Henderson, Farabow, Garrett, & Dunner

[57] ABSTRACT

A hot plate and temperature-holding plate are set in a vacuum chamber. A blank mask is taken into the vacuum chamber through an inlet port. The blank mask is placed on the hot plate. The interior pressure of vacuum chamber is reduced to a level ranging between 0.1 torr and 0.9 torr. Under this condition the blank mask is baked at a temperature of 100° C.±5° C. for 3 minutes. After the baking is brought to an end, the blank mask is carried by walking beams from the surface of the hot block to the surface of the temperature-holding plate. The blank mask is cooled to approximately room temperature on the temperature-holding plate. When the blank mask reaches the predetermined temperature level, a plasma is generated by a high frequency power source between the electrode plate, set above the blank mask and temperature-holding block, for the predetermined length of time, thereby descumming the blank mask.

10 Claims, 4 Drawing Sheets

APPARATUS FOR FORMING A RESIST PATTERN

BACKGROUND OF THE INVENTION

This invention relates to a resist pattern-forming apparatus which bakes a substrate having a developed resist pattern and descums said pattern.

A substrate on which the predetermined resist pattern is formed after light projection and development, and which is used as an etching mask, undergoes a baking process to eliminate the developing solution deposited on the resist pattern formed on the substrate, and also undergoes a descumming process to remove the scum which has settled on said resist pattern, and is later used as an etching mask for a semiconductor substrate. In the baking step, a substrate on which a resist pattern is formed is put into an oven kept at a temperature of, for example, 100°±5° C., for 10 to 60 minutes. Later in the descumming step, the substrate which has been fully baked is allowed to cool in the air for 60 minutes. The substrate undergoes plasma treatment for 1 to 10 minutes in an atmosphere of moist oxygen gas which is held in a vacuum chamber, has a pressure of pb 0.1 to 0.9 torr, and is held at a temperature of 25°±10° C. As a result, said substrate is descummed.

However, the conventional process has the drawbacks, in that the baking of the substrate and the cooling of the baked substrate consumes 1 to 2 hours, and moreover, an operator has to carry the baked substrate from the oven to the descumming apparatus. Consequently, the operation of baking and later descumming the substrate is carried out very inefficiently. When a certain number of substrates are descummed one after another, the temperature in the vacuum chamber is raised from the room temperature to about 40° C. by the action of plasma. As a result, the substrate temperature also rises, resulting in a noticeable increase in the descumming rate of the resist pattern. This event causes the resist pattern dimensions to vary up to a maximum of about 0.5 microns before and after the pattern is descummed. A method has been proposed to operate the descumming apparatus intermittently in order to avoid the above-mentioned variations in the measurements of the resist pattern. However, this proposed method has the drawback that a waiting time of between 10 and 60 minutes has to elapse between the time when one substrate is descummed and the time at which the succeeding substrate is supplied for the descumming operation-a tremendous decline in descumming efficiency.

The above-mentioned drawbacks are observable also in the case where ozone is taken into the vacuum chamber from an ozone generator, to carry out the descumming operation.

SUMMARY OF THE INVENTION

It is accordingly the object of this invention to provide a resist pattern-forming apparatus which efficiently carries out the sequential steps of baking, cooling, and descumming a substrate, thereby minimizing variations in the resist pattern dimensions.

To attain the above-mentioned object, the resist pattern-forming apparatus, embodying this invention, which bakes a substrate on which the predetermined resist pattern is developed, and then descums said substrate, comprises a vacuum chamber whose interior is mechanically evacuated, baking means which is provided in said vacuum chamber and bakes said substrate in a vacuum, temperature-holding means which is provided in said vacuum chamber to set the temperature of the baked substrate at the predetermined level, transport means for carrying said substrate from said baking means to said temperature-holding means, descumming means for descumming the surface of said baked substrate while the temperature of said substrate is held at the predetermined level by said temperature-holding means, means for detecting the temperature o-f the substrate placed on said temperature-holding means, and means for actuating said descumming means for a predetermined length of time when said temperature-holding means detects the predetermined temperature level.

According to the resist pattern-forming apparatus of the present invention, a substrate is set in a vacuum chamber, the substrate is bake at the predetermined temperature by baking means, the baked substrate is carried to the temperature-holding means by transport means, the substrate temperature is held to the predetermined level by said temperature-holding means, and the surface of the baked substrate is descummed by descumming means.

In the above-mentioned case, the descumming means is put into operation for the predetermined length of time when the baked substrate reaches the prescribed temperature level by means for actuating said descumming means. Since the baking of the substrate, holding of temperature of the substrate, and descumming operation are carried out in a single chamber, the whole series of operations can be performed very efficiently. Further, the descumming operation takes place while the substrate temperature is held to the predetermined level, thereby suppressing a rise in the substrate temperature which might otherwise result from the descumming operation, and consequently minimizing dimensional variations in the resist pattern formed on the substrate.

DETAILED DESCRIPTION OF THE PREFERRED EMBODIMENT

Figure 1:
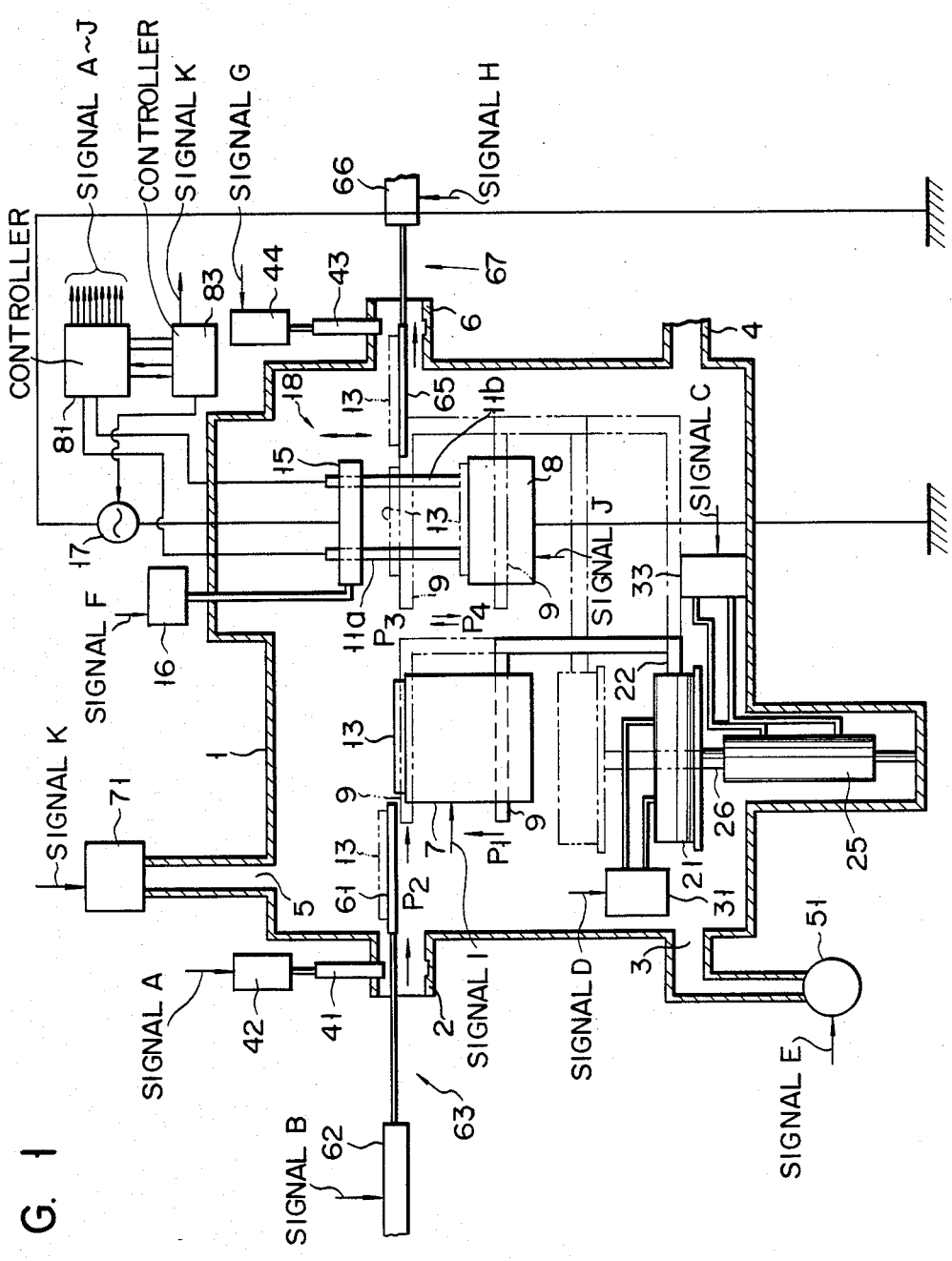
FIG. 1 is a sectional view of a resist pattern-forming apparatus embodying this invention.
Figure 2:
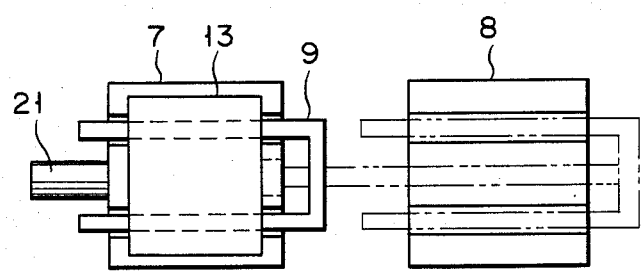
FIG. 2 is a plan view of the transport means of said apparatus.

A detailed description will now be made, with reference to the appended drawings, of a descumming apparatus embodying this invention. Reference numeral 1 denotes a vacuum chamber. Substrate inlet port 2 is provided at the upper part of one side wall of vacuum chamber 1. Substrate outlet port 6 is open at the upper part of the other side wall of vacuum chamber 1. Oxygen gas inlet port 5 is formed in the top wall of vacuum chamber 1. Exhaust port 3 is provided at the lower part of said one side wall of vacuum chamber 1. Leak port 4 is open at the lower part of said other wall of vacuum chamber 1. Oxygen gas feeder 71 is connected to said oxygen gas inlet port 5. Oxygen gas is taken into said vacuum chamber 1 from said oxygen gas feeder 71. Vacuum pump 51 is connected to said exhaust port 3. When vacuum pump 51 is operated, gas in vacuum chamber 1 is expelled, thereby holding the interior of vacuum chamber 1 in an evacuated state. Shutters 41, 43 are respectively fitted to said substrate inlet port 2 and said substrate outlet port 6. Shutters 41, 43 are respectively operated by corresponding driving devices 42, 44. Shutters 41, 43 are opened when the substrate is taken in and out, and closed when vacuum chamber 1 is evacuated. Hot plate 7 is set by the side of substrate inlet port 2 formed in vacuum chamber 1. Two grooves are formed in hot plate 7 along the locus of later described walking beams 9. A heater is embedded in hot plate 7 to heat its top wall. The substrate taken into chamber 1 is mounted from inlet port 2 onto hot plate 7 by transporter 63 equipped with substrate carrier 61 and drive section 62. The upper wall of hot plate 7 is so positioned as to be inserted into the opening of substrate inlet port 2. The substrate consists of blank mask 13 which is fabricated by coating an EB resist film of polymethacrylate on a film substrate, and subjecting said EB resist film to light projection and development. Provided near substrate outlet port 6 of hot plate 7 is temperature-holding plate 8. The upper wall of this temperature-holding plate 8 is positioned lower than that of said hot plate 7. Blank mask 13 is mounted on the upper wall of said temperature-holding plate 8. As in the case of hot plate 7, two grooves are cut out in said temperature-holding plate 8 along the locus of the later described walking beams. Embedded in temperature holding plate 8 are a heater and a pipe allowing for the circulation of a cooling medium. The heater and cooling medium cooperate to cool blank mask 13, mounted on temperature-holding plate 8, in accordance with the temperature and heat capacity of blank mask 13 when it is baked, down to the predetermined level, for example, approaching room temperature. Said temperature-holding plate 8 is grounded and used as one of the electrodes of the later described plasma generator.

Reference numeral 9 in FIG. 1 denotes a pair of walking beams each consisting of a beam-shaped rail. The paired walking beams 9 are connected to piston 22 of cylinder 21. Cylinder 21 is set below hot block 7, and is connected to oil pressure pump 31. Piston 22 is made to move back and forth by controlling the oil pressure in cylinder 21 by said oil pressure pump 31. The back and forth movement of piston 22 causes the horizontal travel of walking beam 9. Provided below cylinder 21 is another cylinder 25. Piston 26 moves back and forth in cylinder 25 through oil pressure therein, which is controlled by means of oil pressure pump 33. The back and forth movement of piston 26 leads to the vertical movement of cylinder 21 and consequently the similar vertical movement of walking beams 9. Walking beams 9 capable of traveling in the horizontal and vertical directions are made to travel from the position $P_1$ indicated by a solid line to positions $P_2$, $P_3$, $P_4$ denoted by 2 dots-dash lines. As a result, blank mask 13 is carried from above hot plate 7 to above temperature-holding plate 8.

Vertically movable electrode plate 15 is provided above temperature-holding plate 8. Said electrode plate 15 is connected to drive means 16, and made to travel vertically thereby. Said electrode plate 15 is penetrated by two temperature sensors 11a, 11b. When electrode plate 15 is brought down, temperature sensors 11a, 11b contact blank mask 13 positioned above temperature-holding plate 8 to measure the temperature of said blank mask 13. Provided above vacuum chamber 1 is high frequency power source 17, one of whose terminals is connected to electrode plate 15, and the other of whose terminals is grounded. High frequency power source 17, electrode plate 15, and temperature-holding plate 8 jointly constitute plasma generator 18. When electrode plate 15 is let fall, temperature sensors 11a, 11b contact the blank mask deposited on temperature-holding plate 8. When said temperature sensors 11a, 11b detect the point in time at which the temperature has fallen to the predetermined level, plasma is generated between electrode plate 15 and temperature-holding plate 8. Blank mask 13 is descummed by said plasma. After being descummed, blank mask 13 is transferred to the outside of vacuum chamber 1 through outlet port 6 by transporter 67 equipped with substrate carrier 65 and drive section 66.

Figure 4:
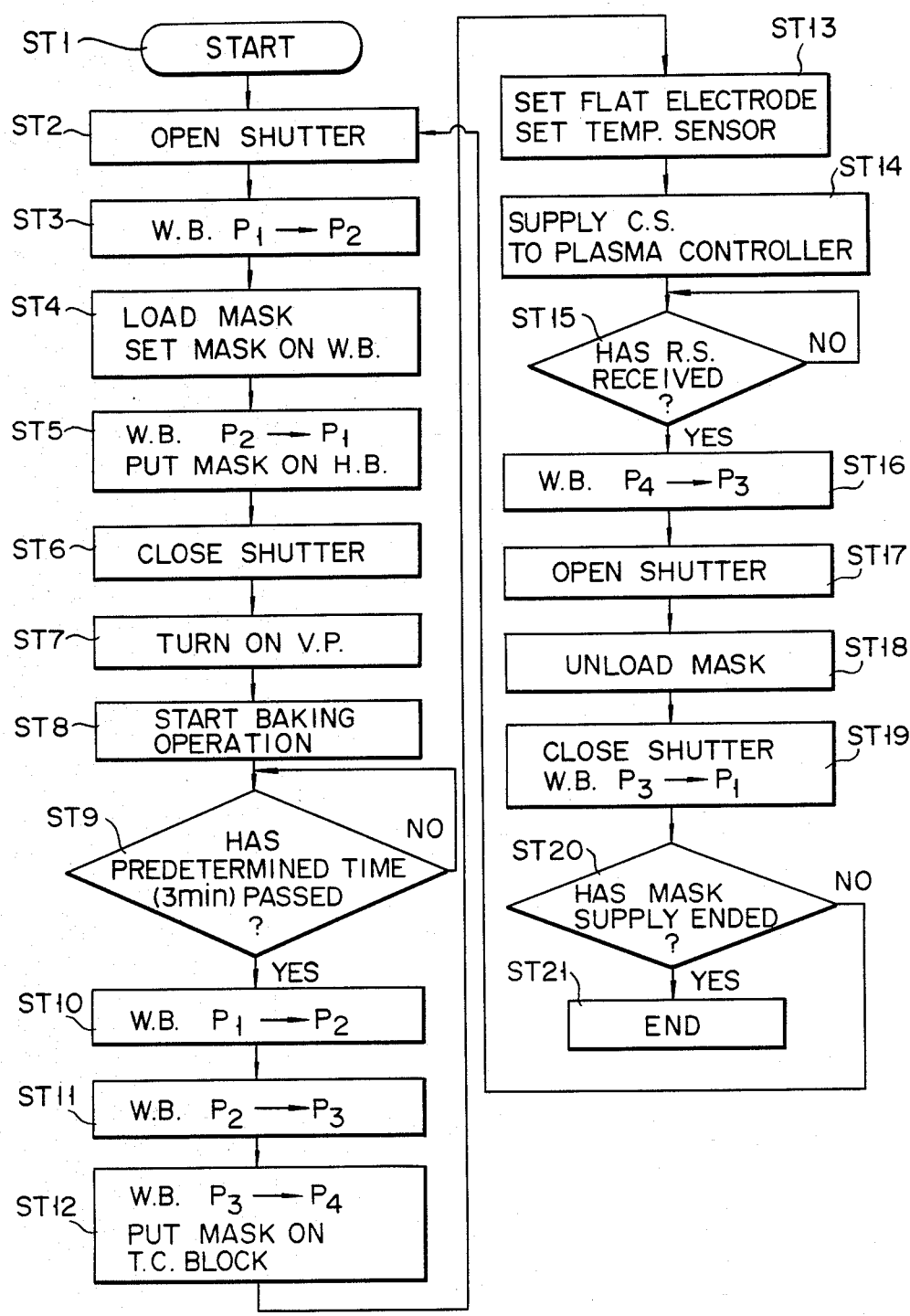
FIG. 4 is a flow chart showing the sequential steps of controlling the operation of the resist pattern-forming apparatus embodying the present invention.

Reference numeral 81 represents a process controller, which, as shown in the flow chart of FIG. 4, controls the movement of transporters 63, 67, the opening and closure of shutters 41, 43, the travel of walking beams 9, the operation of vacuum pump 51, the length of time for which blank mask 13 is baked, and the movement of electrode plate 15. Said process controller 81 is supplied with output signals from temperature sensors 11a, 11b, and issues a control signal to later described plasma controller 83 when temperature sensors 11a, 11b indicate the predetermined temperature level.

Figure 3:
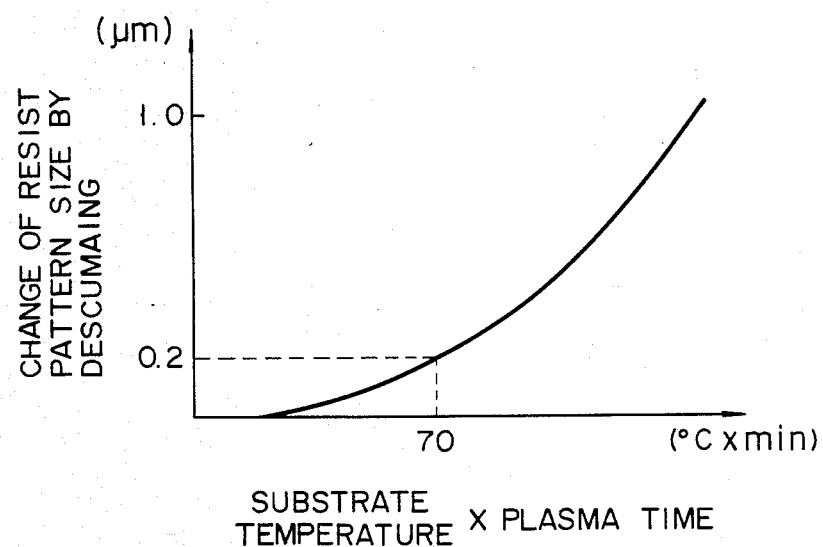
FIG. 3 graphically illustrates the relationship between a value arrived at by multiplying the substrate temperature by the period in which plasma is applied, and the dimensional changes of a resist pattern formed on the substrate.

When it receives a control signal from process controller 81, plasma controller 83 actuates high frequency power source 17 to generate plasma between electrode plate 15 and temperature-holding plate 8. In this case, plasma controller 83 controls the operating time of high frequency power source 17, that is, the time of plasma treatment. The time of plasma treatment is determined, as shown in FIG. 3, by the relationship between a number arrived at by multiplying the substrate temperature by the time of plasma treatment and the dimensional variations of the resist pattern.

The resist pattern-forming apparatus of this embodiment arranged as described above has its operations controlled by process controller 81.

Figure 5:
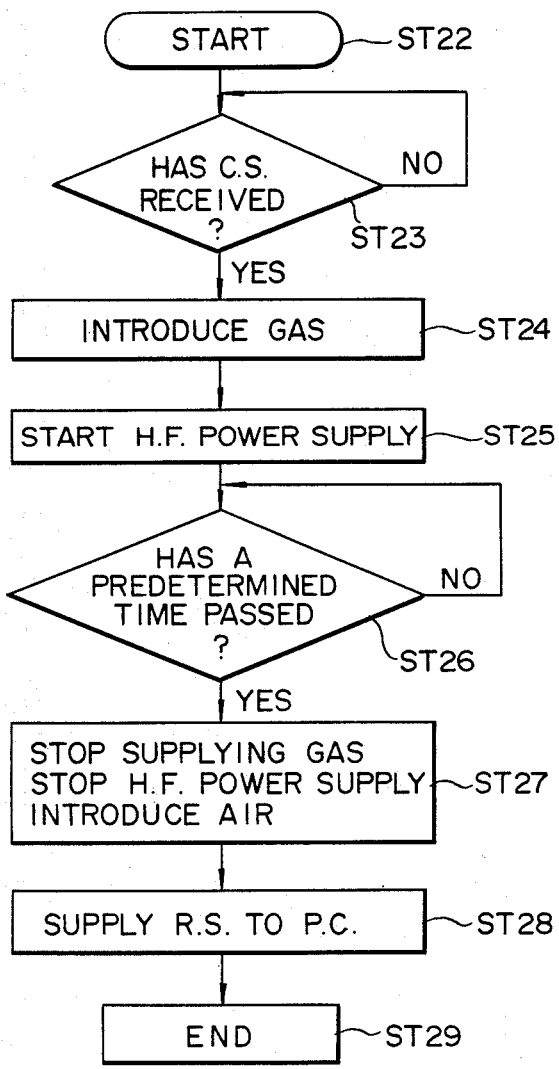
FIG. 5 is a flow chart indicating the sequential steps of putting a plasma controller into operation.

A description will now be made, with reference to FIG. 4, of the control operation of process controller 81. In Step 1, process controller 81 is started. In Step 2, a signal is sent to drive device 42 to open shutter 41. In Step 3, a signal is delivered to oil pressure pump 33, and piston 22 is moved forward to cause walking beams 9 to travel from point $P_1$ to point $P_2$. In Step 4, a signal is sent to bring in transporter 63 of blank mask 13, to place it on walking beams 9, held in vacuum chamber 1. In Step 5, a signal is issued to oil pressure pump 33 to push back piston 22, to carry walking beams 9 from point $P_2$ to point $P_1$, thereby placing blank mask 13 on hot plate 7. In Step 6, a signal is delivered to drive device 42 to close shutter 41. In Step 7, a signal is supplied to vacuum pump 51 for its actuation, thereby evacuating chamber 1 to the level of 0.1 to 0.9 torr. In Step 8, a signal is issued to a heater placed in hot plate 7 to heat it to, for example, 100° C.±5° C., thereby commencing the baking of blank mask 13. In Step 9, blank mask 13 is held on hot plate 7 for the predetermined length of time (for example, for 3 minutes including the working time of vacuum pump 51). In Step 10, a signal is supplied to oil pressure pump 33 after the baking of blank mask 13, to push piston 26, thereby shifting walking beams 9 from point $P_1$ to point $P_2$, and placing blank mask 13 on walking beams 9. In Step 11, a signal is supplied to oil pressure pump 31 to push piston 22, thereby shifting walking beams 9 from point $P_2$ to point $P_3$. In Step 12, a signal is sent to oil pressure pump 33, to push back piston 26 and shift walking beams 9 from point $P_3$ to point $P_4$, and place blank mask 13 on temperature-holding plate 8. A signal is issued to temperature-holding plate 8 to maintain the predetermined temperature level. In Step 13, a signal is delivered to drive device 16 to lower electrode plate 15 together with temperature sensors 11a, 11b. Electrode plate 15 is set at the predetermined point, and temperature sensors 11a, 11b are brought into contact with blank mask 13, thereby making preparations for plasma treatment. In Step 14, a control signal is issued to plasma controller 83 when temperature sensors 11a, 11b detect the predetermined temperature, and plasma controller 83 is operated in accordance with the later described flow chart (FIG. 5). In Step 15, the subsequent progress of the program is stopped, until control by plasma controller 83 is brought to an end. The program is again allowed to advance when plasma treatment is brought to an end, and a return signal is sent from plasma controller 83. In Step 16, a signal is issued to oil pressure pump 33, and piston 26 is pushed to shift walking beams 9 from point $P_4$ to point $P_3$, thereby placing blank mask 13 on walking beams 9. In Step 17, a signal is delivered to drive device 44, to open shutter 43. In Step 18, a signal is supplied to transporter 67, to set blank mask 13 on substrate carrier 65. Thereafter blank mask 13 is taken out of vacuum chamber 1 through outlet port 6. In Step 19, a signal is sent to drive device 44, to close shutter 43. A signal is also supplied to oil pressure pump 31 and oil pressure pump 33, to retract pistons 22, 26, and shift walking beams 9 from point $P_3$ to point $P_1$. In Step 20, the program is repeated, starting with Step 2, when a descumming mask is present. In Step 21, when said descumming masks are no longer present, the program is brought to an end.

A description will now be made, with reference to FIG. 5, of the controlling action of plasma controller 83. In Step 22, plasma controller 83 is made to start in advance. In Step 23, the progress of the program is suspended until a control signal is supplied from process controller 81. On arrival of said control signal the program is allowed to advance. In Step 24, a signal is issued to an oxygen gas feeder to take oxygen gas into vacuum chamber 1, as plasma gas. In Step 25, a signal is delivered to high frequency power source 17 to generate plasma between electrode plate 15 and temperature-holding plate 8. The plasma descums blank mask 13. In Step 26, the generation of plasma is continued for the predetermined length of time, and then the program is allowed to advance. Said predetermined length of time is defined by the relationship between a value arrived at by multiplying the substrate temperature, shown in FIG. 3, by the time of plasma treatment and the dimensional variations of the resist pattern, caused by the descumming operation. In Step 27, when the descumming operation is brought to an end, the supply of oxygen gas and the operation of high frequency power source 17 are stopped. Leak port 4 is opened to let air into the vacuum chamber, to return the internal pressure of vacuum chamber 1 to normal level. In Step 28, a return signal is sent to process controller 81, and in Step 29, the control operation is brought to an end.

As mentioned above, in this embodiment, since the series of steps of baking blank mask 13, cooling it, and then carrying out the descumming operation can be performed in succession in a single chamber, operation efficiency can be noticeably elevated.

Since blank mask 13 is placed on temperature-holding plate 8 and cooled to a temperature which is near a room temperature, and then blank mask 13 is descummed with plasma, the temperature rise of blank mask 13 due to the plasma is suppressed. Moreover, the temperature of blank mask 13 and the time of plasma treatment can be defined according to the relationship between a value arrived at by multiplying the temperature of blank mask 13 by the time of plasma treatment and the dimensional variations of the resist pattern. Therefore, the dimensional variations of the resist pattern can be made small.

Since the top wall of temperature-holding plate 8 is positioned below the surface of hot plate 7 which is kept at a high temperature, heat release from hot plate 7 is effectively shut off when blank mask 13 is placed on said temperature-holding plate 8, and the satisfactory temperature-holding property of blank mask 13 is ensured.

Further, since temperature-holding plate is used, temperature control of blank mask 13 is facilitated even when variations take place in the heat capacity of blank mask 13 and the baking temperature.

In the foregoing embodiment of the present invention, the substrate was carried by means of the walking beam. However, the substrate can be made to travel, for example, by clamping the substrate between proper members or by any other transport means. In the foregoing embodiment, descumming means was formed of a plasma generator constructed by assembling a high frequency power source and plasma generating electrode. However, the plasma generating means need not be limited to the above-mentioned arrangement. It is possible to apply any other type of plasma generator, for example, an ozone generator which is designed to take ozone into vacuum chamber 1. In the foregoing embodiment, a hot block was utilized as baking means. However, baking means need not be limited to this type. It is possible to utilize an oven, a heating device using ultraviolet or infrared rays, or any other heating device.

What is claimed is:

1. A resist pattern-forming apparatus which bakes a substrate on which a predetermined resist pattern has been developed and descums said substrate, comprising:
    a vacuum chamber operable to be mechanically evacuated;
    baking means set in said vacuum chamber to bake said substrate;
    temperature holding means provided in said vacuum chamber to maintain the baked substrate at a predetermined temperature;
    transport means for carrying said substrate from said baking means to said temperature holding means;
    descumming means for descumming a surface of said substrate while said temperature holding means maintains said surface at the predetermined temperature level;
    means for detecting the temperature of the substrate placed on said temperature-holding means; and
    means for operating said descumming means for a predetermined length of time at times when said detecting means detects the predetermined temperature level.

2. The resist pattern-forming apparatus according to claim 1, wherein said baking means includes a hot plate for heating the substrate placed thereon.

3. The resist pattern-forming apparatus according to claim 2, wherein said temperature-holding means includes means for maintaining the baked substrate at a temperature lower than the baking temperature.

4. The resist pattern-forming apparatus according to claim 3, wherein said temperature-holding means includes a temperature-holding plate provided with an internal heater and a pipe through which a cooling medium circulates; and said substrate is placed on said temperature-holding plate to be maintained at the predetermined temperature level by holding means of said heater and cooling medium.

5. The resist pattern-forming apparatus according to claim 4 wherein said temperature-holding plate has a top wall, said hot plate has an upper surface, and the top wall of said temperature-holding plate is positioned lower than the upper surface of said hot plate.

6. The resist pattern-forming apparatus according to claim 1, wherein said transport means includes walking beams for carrying said substrate on it.

7. The resist pattern-forming apparatus according to claim 6, wherein said transport means comprises a first cylinder and piston for moving said walking beams in a substantially horizontal direction, and a second cylinder and piston for carrying said walking beams in a substantially vertical direction.

8. The resist pattern-forming apparatus according to claim 4, wherein said descumming means includes a pair of electrodes and a high frequency power source, and a plasma is generated between said paired electrodes by said high frequency power source.

9. The resist pattern-forming apparatus according to claim 8, wherein said temperature-holding plate constitutes one of said paired electrodes.

10. The resist pattern-forming apparatus according to claim 1, wherein said means for operating said descumming means includes means for controlling the substrate temperature during the descumming operation and the length of time of said descumming operation in accordance with the relationship between a value arrived at by multiplying the substrate temperature, during the descumming operation, by the duration of said descumming operation and the dimensional variations of the resist pattern.

* * * * *